United States Patent
Cusin et al.

(10) Patent No.: US 10,001,749 B2
(45) Date of Patent: *Jun. 19, 2018

(54) RESONATOR WITH REDUCED SENSITIVITY TO CLIMATIC VARIATIONS

(71) Applicant: Nivarox-FAR S.A., Le Locle (CH)

(72) Inventors: Pierre Cusin, Villars-Burquin (CH); Thierry Hessler, St-Aubin (CH); Fatmir Salihu, Neuchatel (CH); Lucie Brocher, Sion (CH); Hung Quoc Tran, Bienne (CH)

(73) Assignee: Nivarox-FAR S.A., Le Locle (CH)

(*) Notice: Subject to any disclaimer, the term of this patent is extended or adjusted under 35 U.S.C. 154(b) by 0 days. days.

This patent is subject to a terminal disclaimer.

(21) Appl. No.: 14/438,059

(22) PCT Filed: Oct. 10, 2013

(86) PCT No.: PCT/EP2013/071214
§ 371 (c)(1),
(2) Date: Apr. 23, 2015

(87) PCT Pub. No.: WO2014/075859
PCT Pub. Date: May 22, 2014

(65) Prior Publication Data
US 2015/0301502 A1 Oct. 22, 2015

(30) Foreign Application Priority Data
Nov. 16, 2012 (EP) .................................... 12193057

(51) Int. Cl.
*G04B 17/22* (2006.01)
*G04B 17/24* (2006.01)
(Continued)

(52) U.S. Cl.
CPC ......... *G04B 17/063* (2013.01); *G04B 17/066* (2013.01); *G04B 17/22* (2013.01);
(Continued)

(58) Field of Classification Search
CPC .... G04B 17/066; G04B 17/22; G04B 17/227; G04B 17/24
(Continued)

(56) References Cited

U.S. PATENT DOCUMENTS 3,368,919 A * 2/1968 Casale .................. H01C 1/032
257/635
3,615,947 A * 10/1971 Yamada ............ H01L 21/31111
148/DIG. 106
(Continued)

FOREIGN PATENT DOCUMENTS

CH 699 780 4/2010
CH 701605 A2 * 2/2011 ........... G04B 17/066
(Continued)

OTHER PUBLICATIONS

"Tantalum", Jan. 17, 2010, Retrieved on Apr. 28, 2016 from <http://en.wikipedia.org/wiki/Tantalum>, Wikipedia, whole document.*
(Continued)

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A compensating balance spring for a thermally compensated sprung balance resonator including a core formed from at least one non-metallic material. The core is entirely coated with a layer which is moisture proof to render the balance spring less sensitive to climatic variations. The compensating balance spring can be applied to timepieces.

20 Claims, 1 Drawing Sheet

(51) Int. Cl.
G04B 17/06 (2006.01)
H03H 9/02 (2006.01)
H03H 3/007 (2006.01)
H03H 3/02 (2006.01)

(52) U.S. Cl.
CPC .......... *G04B 17/227* (2013.01); *G04B 17/24* (2013.01); *H03H 3/0076* (2013.01); *H03H 9/02448* (2013.01); *H03H 2003/027* (2013.01)

(58) Field of Classification Search
USPC ........................................ 368/171, 175, 182
See application file for complete search history.

(56) References Cited

U.S. PATENT DOCUMENTS

| | | | | |
|---|---|---|---|---|
| 8,641,023 | B2* | 2/2014 | Charbon | F16F 1/024 267/180 |
| 2008/0037376 | A1* | 2/2008 | Lippuner | G04B 15/14 368/139 |
| 2010/0214880 | A1 | 8/2010 | Rappo et al. | |
| 2011/0069591 | A1* | 3/2011 | Daout | G04B 17/066 368/175 |
| 2011/0292770 | A1* | 12/2011 | Damasko | G04B 17/066 368/175 |
| 2011/0305120 | A1* | 12/2011 | Hessler | G04F 5/063 368/159 |
| 2012/0230159 | A1* | 9/2012 | Hessler | G04B 17/227 368/160 |
| 2015/0355600 | A1* | 12/2015 | Cusin | F16F 1/10 368/177 |

FOREIGN PATENT DOCUMENTS

| | | | |
|---|---|---|---|
| EP | 1 837 722 | | 9/2007 |
| WO | 2007 000271 | | 1/2007 |
| WO | WO 2011072960 A1 * | 6/2011 | .......... G04B 17/227 |

OTHER PUBLICATIONS

"Metal", Jul. 10, 2009, Retrieved on Apr. 28, 2016 from <http://en.wikipedia.org/wiki/Metal>, Wikipedia, pp. 1-2.*
"Passivation of Metals", Sep. 23, 2010, Retrieved on Apr. 29, 2016 from <http://www.misumi-techcentral.com/tt/en/surface/2010/08/052-passivation-of-metals.html>, Technical Tutorial, whole document.*
"Titanium Nitride", Nov. 16, 2011, Retrieved on Apr. 29, 2016 from <http://en.wikipedia.org/wiki/Titanium_nitride>, Wikipedia, whole document.*
Noble Metal, Wikipedia, full document, Retrieved on Sep. 6, 2016 from <https://en.wikipedia.org/wiki/Noble_metal>.*
International Search Report dated Feb. 28, 2014 in PCT/EP2013/071214 Filed Oct. 10, 2013.
International Preliminary Report on Patentability dated Jun. 3, 2015 in PCT/EP2013/071214.

* cited by examiner

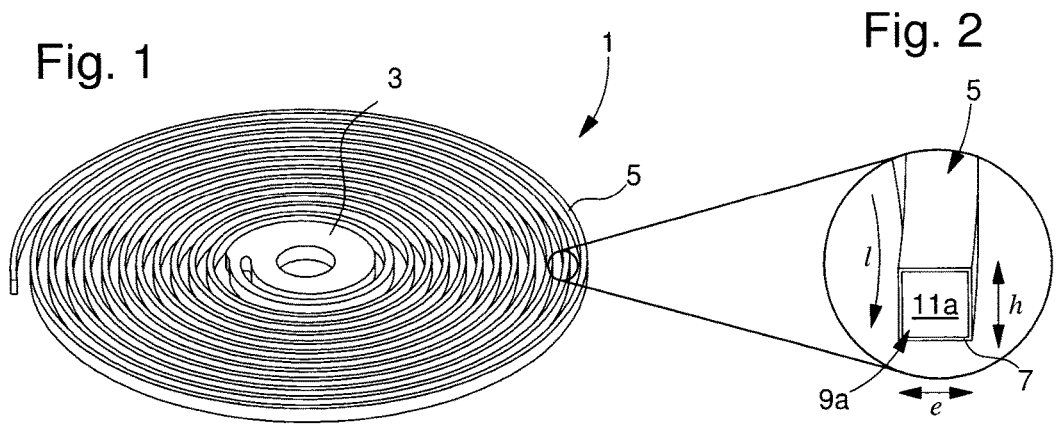
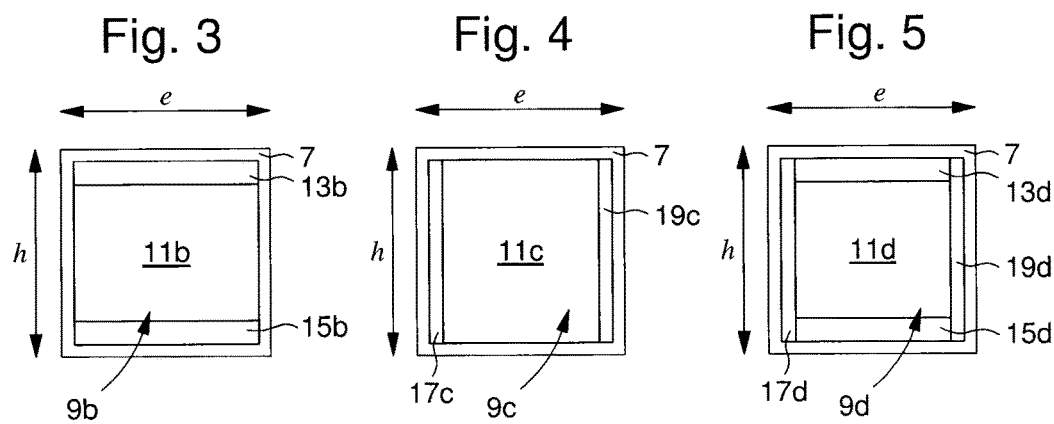
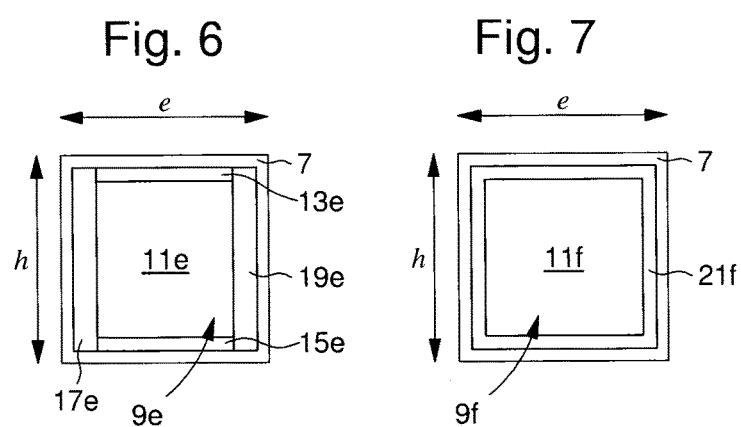

RESONATOR WITH REDUCED SENSITIVITY TO CLIMATIC VARIATIONS

CROSS-REFERENCE TO RELATED APPLICATIONS

This is a National phase application in the United States of International patent application PCT/EP2013/071214 filed Oct. 10, 2013 which claims priority on European patent application 12193057.2 filed Nov. 16, 2012. The entire disclosures of the above patent applications are hereby incorporated herein by reference.

FIELD OF THE INVENTION

The invention relates to a thermally compensated sprung balance resonator wherein the compensating balance spring has reduced sensitivity to climatic variations.

BACKGROUND OF THE INVENTION

During severe condensation tests on timepiece movements, it became apparent that the working of the movements could be affected.

SUMMARY OF THE INVENTION

It is an object of the present invention to overcome all or part of the aforementioned drawbacks, by providing a non-metallic balance spring with reduced sensitivity to climatic variations.

The invention therefore relates to a compensating balance spring for a thermally compensated sprung balance resonator comprising a core formed from at least one non-metallic material which includes quartz or doped silicon (or undoped silicon) on which there is at least partially formed a coating of silicon dioxide, characterized in that the core is entirely coated with a layer which is resistant and impermeable to moisture so as to render the compensating balance spring less sensitive to climatic variations.

It is thus clear that, even in the event of severe condensation, the working of the compensating balance spring will not be disrupted so that the overall working of the resonator, which is formed thereby in cooperation with a balance, is not affected or is barely affected.

In accordance with other advantageous features of the invention:
 the layer which is resistant and impermeable to moisture has a thickness of less than 50 nm;
 the layer which is resistant and impermeable to moisture comprises chromium, titanium or tantalum.

Moreover, the invention relates to a thermally compensated resonator for a timepiece including a balance, characterized in that the balance cooperates with a compensating balance spring according to any of the preceding variants.

BRIEF DESCRIPTION OF THE DRAWINGS

Other features and advantages will appear clearly from the following description, given by way of non-limiting illustration, with reference to the annexed drawings, in which:

FIG. 1 shows a compensating balance spring according to the invention;

FIGS. 2 to 7 show variants of the section of the compensating balance spring according to the invention.

DETAILED DESCRIPTION OF PREFERRED EMBODIMENTS

A study was carried out to determine the behaviour of timepiece movements as a function of severe condensation. The study was carried out by forcing the dew point to be sharply exceeded, for example by maintaining a hygrometry rate of more than 80% and by reducing the temperature by at least 15° C.

It was demonstrated that the working of a timepiece could be affected, in particular where the compensating balance spring of a sprung balance resonator is formed at least partially from a crystalline silicon oxide or an amorphous silicon oxide. This type of compensating balance spring may be formed, for example, from doped or undoped crystalline silicon on which there is at least partially formed a silicon dioxide coating or from quartz.

The study also demonstrated that the influence of severe condensation may be minimised by a barrier against moisture formed on the compensating balance spring comprising a crystalline or amorphous silicon oxide.

Consequently, the invention relates to a compensating balance spring for a thermally compensated sprung balance resonator including a core formed from at least one non-metallic material. Advantageously according to the invention, the core is entirely coated with a layer that is moisture proof, i.e. resistant and impermeable to moisture, in order to render the compensating balance spring less sensitive to climatic variations.

According to the invention, the moisture proof layer has a thickness of less than 50 nm and preferably of around 10 nm to avoid mechanically affecting the working of the balance spring. However, the thickness of the moisture proof layer may be up to several micrometers, but must, in that case, be taken into account as regards the thermal compensation of the sprung balance resonator.

Moreover, it is preferable for the moisture proof layer to be electrically conductive and have low sensitivity to magnetic fields such as, for example, a diamagnetic or paramagnetic layer.

By way of example, the moisture proof layer may thus include chromium, titanium, tantalum, aluminium, zirconium, alumina, chromium oxide, chromium tungsten, PTFE or silicon nitride ($Si_3N_4$). However, chromium, titanium, tantalum or one of their alloys are preferred as they demonstrated the best results.

FIGS. 1 to 7 show variants of a balance spring 1 obtained according to the invention and intended to thermally compensate the resonator thereby formed in cooperation with a balance. Compensating balance spring 1 preferably includes a collet 3 integral with the strip 5 wound into several coils. According to the invention, at least one strip 5 of compensating balance spring 1 is coated with a layer 7, which forms a barrier against moisture.

Strip 5 has a length 1, a thickness e and a height h. It includes a core 9a, 9b, 9c, 9d, 9e, 9f formed from at least one material 11a, 11b, 13b, 15b, 11c, 17c, 19c, 11d, 13d, 15d, 17d, 19d, 11e, 13e, 15e, 17e, 19e, 11f, 21f.

According to the variants of FIGS. 2 to 7, core 9a, 9b, 9c, 9d, 9e, 9f may be formed from a single material 11a such as, for example, quartz, or from several materials 11b, 13b, 15b, 11c, 17c, 19c, 11d, 13d, 15d, 17d, 19d, 11e, 13e, 15e, 17e, 19e, 11f, 21f.

When core 9b, 9c, 9d, 9e, 9f is formed from several materials, it may be entirely coated 11d, 13d, 15d, 17d, 19d, 11e, 13e, 15e, 17e, 19e, 11f, 21f or partially coated 11b, 13b, 15b, 11c, 17c, 19c with several material before strip 5 of balance spring 1 is coated with a layer 7 which is moisture proof, i.e. resistant and impermeable to moisture. Each coating 13b, 15b, 17c, 19c, 13d, 15d, 17d, 19d, 13e, 15e, 17e, 19e may or may not be of the same type and of the same thickness. By way of example, core 9b, 9c, 9d, 9e, 9f may include doped or undoped silicon 11b, 11c, 11d, 11e, 11f, on which there is at least partially formed a silicon dioxide coating 13b, 15b, 17c, 19c, 13d, 15d, 17d, 19d, 13e, 15e, 17e, 19e, 21f.

The invention also relates to a method for fabricating a compensating balance spring 1 for a thermally compensated sprung balance resonator comprising the following steps:

a) forming a balance spring including a thermally compensated core 9a, 9b, 9c, 9d, 9e, 9f formed from at least one material 11a, 11b, 13b, 15b, 11c, 17c, 19c, 11d, 13d, 15d, 17d, 19d, 11e, 13e, 15e, 17e, 19e, 11f, 21f;

b) entirely coating core 9a, 9b, 9c, 9d, 9e, 9f with a layer 7 which is moisture proof so as to render balance spring 1 less sensitive to climatic variations.

According to the invention, step a) may be obtained by etching the desired pattern of the balance spring in the desired plate to form all or part 11a, 11b, 11c, 11d, 11e, 11f, of core 9a, 9b, 9c, 9d, 9e, 9f. In the example of crystalline silicon and quartz, it is possible to envisage a deep reactive ion etching (DRIE) to accomplish step a).

Of course, step a) also includes at least one second phase 13b, 15b, 17c, 19c, 13d, 15d, 17d, 19d, 13e, 15e, 17e, 19e, 21f of partially or totally coating the balance spring obtained from the etch in the first phase to finish the core 9b, 9c, 9d, 9e, 9f. This second phase may, for example, consist of thermal oxidation intended to form a silicon dioxide when a doped or undoped crystalline silicon wafer has been etched in the first phase of step a).

Step b) allows the deposition of a moisture proof layer 7 having a thickness of less than 50 nm and preferably of around 10 nm. Step b) may be accomplished, for example, by any thin layer deposition method, such as vapour phase deposition so as, preferably, to deposit chromium, titanium or tantalum or one of the alloys thereof, which are also advantageously electrically conductive materials insensitive to magnetic fields.

Of course, this invention is not limited to the illustrated example but is capable of various variants and alterations that will appear to those skilled in the art. In particular, any material capable of forming a barrier against moisture may be envisaged and cannot be limited to chromium, titanium or tantalum or one of the alloys thereof or even to the other materials cited in this description.

It is also possible to choose the moisture proof material as a function of its particular colour so as to improve its aesthetic appearance where the timepiece includes parts which enable the balance spring to be seen, such as, for example, a "skeleton" timepiece or a timepiece with a transparent back cover.

The invention claimed is:

1. A compensating balance spring for a thermally compensated sprung balance resonator, comprising:
a core formed from at least one non-metallic material including quartz; and
an electrically conductive and moisture-proof layer, including chromium and entirely coating the core, wherein
the electrically conductive and moisture-proof layer is at least partially formed on an oxidized coating that is interposed between the core and the layer, so that the electrically conductive and moisture-proof layer protects the oxidized coating from being exposed, and
the electrically conductive and moisture-proof layer includes a thickness that is configured to render the compensating balance spring mechanically less sensitive to variations in temperature and moisture when the layer collects condensation of moisture thereon.

2. The compensating balance spring according to claim 1, wherein the layer has a thickness of less than 50 nm.

3. The compensating balance spring according to claim 1, wherein the electrically conductive and moisture-proof layer is configured to render the compensating balance spring less sensitive to climatic variations when the layer collects the condensation of the moisture thereon that is formed under a hygrometry rate of more than 80%.

4. The compensating balance spring according to claim 1, wherein the electrically conductive and moisture-proof layer is diamagnetic, antiferromagnetic or paramagnetic.

5. A compensating balance spring for a thermally compensated sprung balance resonator, comprising:
a core formed from at least one non-metallic material including quartz; and
an electrically conductive and moisture-proof layer, including titanium and entirely coating the core, wherein
the electrically conductive and moisture-proof layer is at least partially formed on an oxidized coating that is interposed between the core and the layer, so that the electrically conductive and moisture-proof layer protects the oxidized coating from being exposed, and
the electrically conductive and moisture-proof layer includes a thickness that is configured to render the compensating balance spring mechanically less sensitive to variations in temperature and moisture when the layer collects condensation of moisture thereon.

6. The compensating balance spring according to claim 5, wherein the layer has a thickness of less than 50 nm.

7. A compensating balance spring for a thermally compensated sprung balance resonator, comprising:
a core formed from at least one non-metallic material including quartz; and
an electrically conductive and moisture-proof layer, including tantalum and entirely coating the core, wherein
the electrically conductive and moisture-proof layer is at least partially formed on an oxidized coating that is interposed between the core and the layer, so that the electrically conductive and moisture-proof layer protects the oxidized coating from being exposed, and
the electrically conductive and moisture-proof layer includes a thickness that is configured to render the compensating balance spring mechanically less sensitive to variations in temperature and moisture when the layer collects condensation of moisture thereon.

8. The compensating balance spring according to claim 7, wherein the layer has a thickness of less than 50 nm.

9. A compensating balance spring for a thermally compensated sprung balance resonator, comprising:
a core formed from at least one non-metallic material including silicon, which is at least partially coated with a silicon dioxide coating; and
an electrically conductive and moisture-proof layer, including chromium and entirely coating the core, wherein
the electrically conductive and moisture-proof layer is at least partially formed on the silicon dioxide coating that is interposed between the core and the layer, so that the electrically conductive and moisture-proof layer protects the silicon dioxide coating from being exposed, and the electrically conductive and moisture-proof layer includes a thickness that is configured to render the compensating balance spring mechanically less sensitive to variations in temperature and moisture when the layer collects condensation of moisture thereon.

10. The compensating balance spring according to claim 9, wherein the layer has a thickness of less than 50 nm.

11. A compensating balance spring for a thermally compensated sprung balance resonator, comprising:
   a core formed from at least one non-metallic material including silicon, which is at least partially coated with a silicon dioxide coating; and
   an electrically conductive and moisture-proof layer, including titanium and entirely coating the core, wherein
   the electrically conductive and moisture-proof layer is at least partially formed on the silicon dioxide coating that is interposed between the core and the layer, so that the electrically conductive and moisture-proof layer protects the silicon dioxide coating from being exposed, and
   the electrically conductive and moisture-proof layer includes a thickness that is configured to render the compensating balance spring mechanically less sensitive to variations in temperature and moisture when the layer collects condensation of moisture thereon.

12. The compensating balance spring according to claim 11, wherein the layer has a thickness of less than 50 nm.

13. A compensating balance spring for a thermally compensated sprung balance resonator, comprising:
   a core formed from at least one non-metallic material including silicon, which is at least partially coated with a silicon dioxide coating; and
   an electrically conductive and moisture-proof layer, including tantalum and entirely coating the core, wherein
   the electrically conductive and moisture-proof layer is at least partially formed on the silicon dioxide coating that is interposed between the core and the layer, so that the electrically conductive and moisture-proof layer protects the silicon dioxide coating from being exposed, and
   the electrically conductive and moisture-proof layer includes a thickness that is configured to render the compensating balance spring mechanically less sensitive to variations in temperature and moisture when the layer collects condensation of moisture thereon.

14. The compensating balance spring according to claim 13, wherein the layer has a thickness of less than 50 nm.

15. A compensating balance spring for a thermally compensated sprung balance resonator, comprising:
   a core formed from at least one non-metallic material including doped silicon, which is at least partially coated with a silicon dioxide coating; and
   an electrically conductive and moisture-proof layer, including chromium and entirely coating the core, wherein
   the electrically conductive and moisture-proof layer is at least partially formed on the silicon dioxide coating that is interposed between the core and the layer, so that the electrically conductive and moisture-proof layer protects the silicon dioxide coating from being exposed, and
   the electrically conductive and moisture-proof layer includes a thickness that is configured to render the compensating balance spring mechanically less sensitive to variations in temperature and moisture when the layer collects condensation of moisture thereon.

16. The compensating balance spring according to claim 15, wherein the layer has a thickness of less than 50 nm.

17. A compensating balance spring for a thermally compensated sprung balance resonator, comprising:
   a core formed from at least one non-metallic material including doped silicon, which is at least partially coated with a silicon dioxide coating; and
   an electrically conductive and moisture-proof layer, including titanium and entirely coating the core, wherein
   the electrically conductive and moisture-proof layer is at least partially formed on the silicon dioxide coating that is interposed between the core and the layer, so that the electrically conductive and moisture-proof layer protects the silicon dioxide coating from being exposed, and
   the electrically conductive and moisture-proof layer includes a thickness that is configured to render the compensating balance spring mechanically less sensitive to variations in temperature and moisture when the layer collects condensation of moisture thereon.

18. The compensating balance spring according to claim 17, wherein the layer has a thickness of less than 50 nm.

19. A compensating balance spring for a thermally compensated sprung balance resonator, comprising:
   a core formed from at least one non-metallic material including doped silicon, which is at least partially coated with a silicon dioxide coating; and
   an electrically conductive and moisture-proof layer, including tantalum and entirely coating the core, wherein
   the electrically conductive and moisture-proof layer is at least partially formed on the silicon dioxide coating that is interposed between the core and the layer, so that the electrically conductive and moisture-proof layer protects the silicon dioxide coating from being exposed, and
   the electrically conductive and moisture-proof layer includes a thickness that is configured to render the compensating balance spring mechanically less sensitive to variations in temperature and moisture when the layer collects condensation of moisture thereon.

20. The compensating balance spring according to claim 19, wherein the electrically conductive and moisture-proof layer has a thickness of less than 50 nm.

* * * * *